United States Patent

Purdy et al.

[15] 3,648,167

[45] Mar. 7, 1972

[54] FLUID-COOLED APPARATUS FOR TESTING POWER SEMICONDUCTOR DEVICES

[72] Inventors: Don Ryall Purdy, Florham Park; William Edward Donnelly, Edison, both of N.J.

[73] Assignee: RCA Corporation

[22] Filed: June 1, 1970

[21] Appl. No.: 41,843

[52] U.S. Cl. ........................................324/158 T, 317/234 B

[51] Int. Cl. ........................................................G01r 1/04

[58] Field of Search........................324/158 R, 158 F, 158 T; 317/100, 234, 234 B

[56] References Cited

UNITED STATES PATENTS

| | | | |
|---|---|---|---|
| 2,942,165 | 6/1960 | Jackson et al. | 317/234 |
| 2,992,372 | 7/1961 | Himeon et al. | 317/234 |
| 3,204,157 | 8/1965 | Peterson | 317/234 |
| 3,389,305 | 6/1968 | Bond | 317/100 |
| 3,400,543 | 9/1968 | Ross | 317/234 |
| 3,524,497 | 8/1970 | Chu et al. | 317/100 |
| 3,118,071 | 1/1964 | Herzog | 307/88.5 |

*Primary Examiner*—Eli Lieberman
*Attorney*—Glenn H. Bruestle

[57] ABSTRACT

The apparatus includes a base member having an upper surface and a cavity therein, with a channel in the interior which communicates with the cavity. The surface has an aperture communicating with the cavity. A power semiconductor device is held in the aperture with an outer heat transfer surface of the device exposed in the cavity, and a fluid is circulated through the channel and cavity and across the heat transfer surface. A tunable weir in the cavity provides means for controlling the fluid, to minimize the thermal resistance between the heat transfer surface and the fluid.

7 Claims, 4 Drawing Figures

INVENTORS
WILLIAM E. DONNELLY &
BY DON R. PURDY
H. L. Allen
Attorney

FLUID-COOLED APPARATUS FOR TESTING POWER SEMICONDUCTOR DEVICES

BACKGROUND OF THE INVENTION

The present invention relates to power semiconductor devices, and more particularly, relates to apparatus for testing and cooling such devices.

In the manufacture of power semiconductor devices, such as thyristors, transistors, and rectifiers, the active device is usually soldered or brazed to a heat transfer member in a hermetic package. In actual use, the package is mounted with an outer heat transfer surface of the heat transfer member flush against a heat sink.

In final testing, it is often necessary to conduct the device through many cycles of operation to determine if it is capable of meeting the specified thermal and electrical characteristics. In order to perform these tests, the device is usually bolted to a heat sink in the manner described above. However, for test purposes it is difficult to rapidly recycle the device when mounted in this manner, because of the finite thermal resistance between the outer heat transfer surface and the heat sink. Additionally, the thermal resistance between the high-voltage junction of the device (for example, the base-collector junction of a power transistor) and the heat transfer surface is difficult to measure because it is otherwise obscured by the thermal resistance between the outer heat transfer surface and the heat sink. Further, the plating finish on the heat transfer surface becomes scored and scratched due to handling and mounting, often requiring additional plating of that surface after testing is completed.

It is also known to circulate a fluid through channels in the heat sink and around the device, in order to more efficiently conduct heat away from the heat transfer surface of the device mounted on the heat sink. See, for example, U.S. Pat. No. 3,389,305, to Bond, and U.S. Pat. No. 2,815,473, to Ketteringham et al. While such arrangements provide a good degree of heat transfer efficiency, it would still be desirable to provide an even greater degree of efficiency, by minimizing the thermal resistance between the outer heat transfer surface of the device and the circulating fluid. This would be especially useful for testing purposes, because the thermal resistance between the high voltage junction of the device and the heat transfer surface could be easily determined.

SUMMARY OF THE INVENTION

The present invention comprises an apparatus for cooling a power semiconductor device. The apparatus includes a base member having a major surface and a cavity within the base member. The surface of the base member has an aperture which communicates with the cavity. The apparatus further includes means for holding the power semiconductor device in the aperture, so that an outer heat transfer surface of the device is exposed in the cavity. Additionally, the apparatus includes means for circulating a fluid through the cavity and across the heat transfer surface; and means in the cavity for controlling the circulating fluid, so as to minimize the thermal resistance between the fluid and the heat transfer surface.

THE DRAWINGS

DETAILED DESCRIPTION

Figure 1:
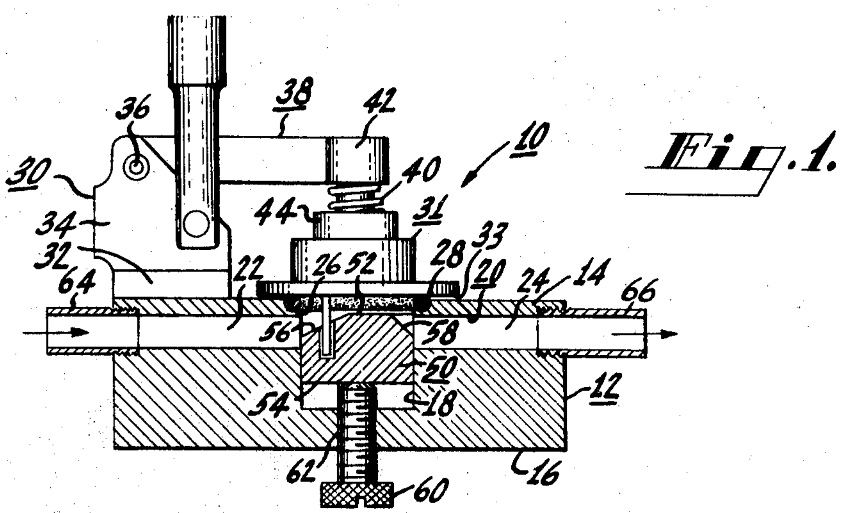
FIG. 1 is a side view of a preferred embodiment of the apparatus, with a portion shown in cross section.

A preferred embodiment of the apparatus will be described with reference to FIG. 1. The apparatus, designated generally as 10, includes a base member 12 (shown in cross section) having opposed upper and lower major surface 14 and 16, respectively. The base member 12 has a cavity 18 therein and a channel 20 in the interior of the base member which communicates with the cavity. The channel 20 includes an input portion 22 and an output portion 24, both of which are substantially parallel to the upper surface 14. The upper surface 14 has an aperture 26 which communicates with the cavity 18. A resilient insulating and sealing ring 28 surrounds the periphery of the aperture 26.

The apparatus 10 further includes a holding and locking member 30 which is adapted to secure a power semiconductor device in the aperture 26 and against the resilient ring 28, with an outer heat transfer surface of the device exposed in the cavity 18. Such a device 31, in a standard TO–3 package, is shown in FIG. 1, with its heat transfer surface designated as 33. The holding and locking member 30 has an extension 32 which is mounted on the upper surface 14 and extends above that surface. A pivot plate 34 is rotatably mounted on the upper end of the extension 32 by means of a pivot pin 36. A locking arm 38 is fastened to the pivot plate 34 at the pin 36, and extends over the cavity 18. A spring 40 is fastened to the lower surface of the outer end portion 42 of the locking arm 34. A pressure plate 44 is mounted on the end of the spring 40, and is adapted to apply the pressure developed by the spring 40 to hold the device 31 in the aperture 26 and against the resilient ring 28.

The base member 12 further includes input and output nozzles 64 and 66 which extend into the input and output portions 22 and 24, respectively, of the channel 20. The input and output portions 22 and 24, and the nozzles 64 and 66 provide means for circulating a fluid (not shown) into the cavity 18 and across the heat transfer surface 33 of the device 31.

Additionally, the apparatus includes means in the cavity for controlling the circulating fluid, so as to minimize the thermal resistance between the heat transfer surface 33 and the fluid. In one embodiment, this control means comprises a tunable weir 50 which is slidably mounted in the cavity 18. The weir has upper and lower surfaces 52 and 54, respectively. Preferably, an edge 56 of the upper surface 52 which is adjacent the input portion 22 of the channel 20 is beveled at an angle with the input portion; and, the opposing edge 58 of the upper surface 52 which is adjacent the output portion 24 is beveled at an angle with the output portion. A bolt 60 extends through a threaded hole 62 between the lower surface 16 of the base member 12, and the cavity 18. The bolt extends to the lower surface 54 of weir 50, and provides means for tuning the weir in the cavity 18. The manner in which the weir is used to minimize the thermal resistance between the heat transfer surface 33 and the fluid will be described below.

The apparatus 10 also includes means for making electrical contact to the terminal leads of the device 31. The contacting means will be described with reference to FIG. 2, which illustrates a top view of the apparatus, with the holding and locking member 30 and the device 31 removed.

Figure 2:
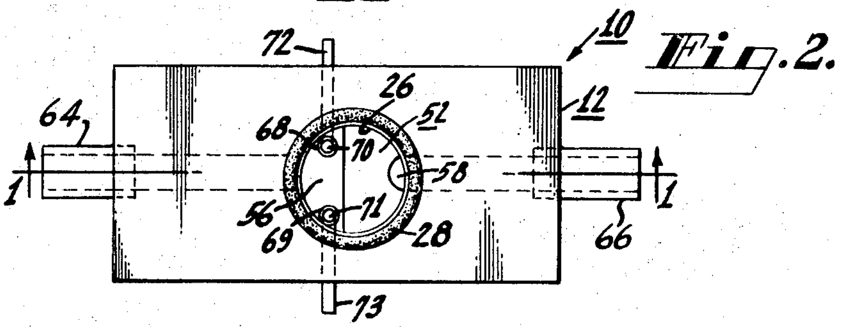
FIG. 2 is a top view of the apparatus of FIG. 1, with a portion of the apparatus removed.

Notice FIG. 2, the beveled surface 52 of the weir 50 has two recesses 68 and 69 which are adapted to receive the terminal leads of the device 31 (FIG. 1) which extend from the heat transfer surface 33. Metal clips 70 and 71 in the aperture 68 and 69, respectively, make direct electrical contact to the terminal leads of the device. Two contact pins 72 and 73 extend through opposite sides of the base member 12 and the weir 50 make electrical contact to the two clips 70 and 71, respectively.

The base member 12 and the weir 50 may be fabricated from a metal such as aluminum, or an insulating material such as plexiglass. The material of the resilient ring 28 is not critical; for example, neoprene is suitable. The various parts of the holding and locking member 30 are preferably fabricated from metal. The dimensions of the various parts of the apparatus are not critical, and depend on the dimensions the device to be cooled and tested. The apparatus may be made by well known mechanical fabrication techniques which are therefore not described herein.

Figures 3, 4:
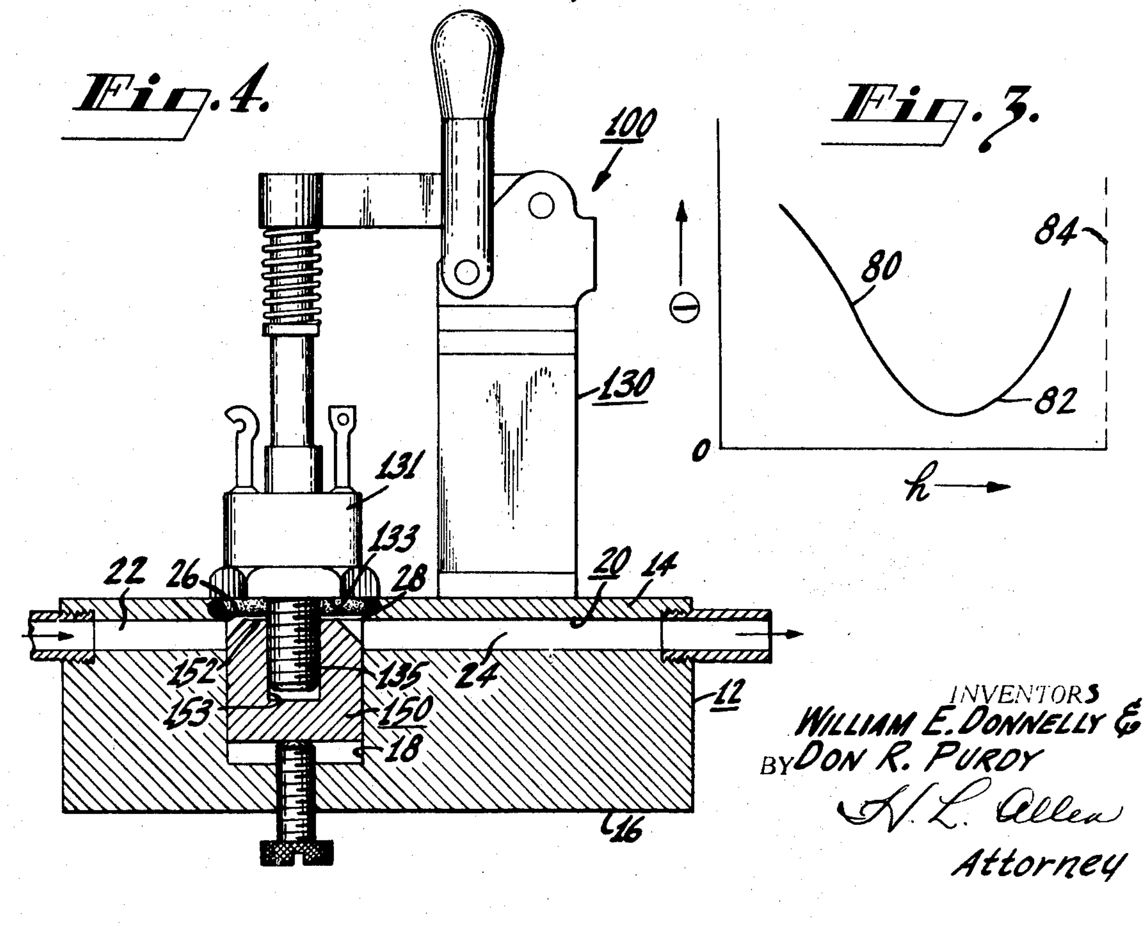
FIG. 3 is a plot of a thermal characteristic of the apparatus of FIG. 1.
FIG. 4 is a side view of an alternate embodiment of the apparatus, with a portion shown in cross section.

The apparatus 10 of FIG. 1 is used to test the device 31 in the following manner. The device 31 is secured to the base member 12 by the locking member 30 with the outer heat transfer surface 33 of the device 31 exposed in the cavity 18. A cooling fluid, such as water, is circulated through the input portion 22, over the beveled surface 52 of the weir 50, and across the heat transfer surface 33. The water pressure and velocity of the circulating fluid is controlled by slowly "tuning " the weir 50; that is, by moving the weir 50 upwards in the cavity 18 by rotation of the screw 60. As the weir 50 is moved upwards, the volume of the cavity 18 between the heat transfer surface 33 and the upper surface 52 of the weir 50 is decreased; this decrease in volume of the cavity 18 increases the velocity gradient between the two surfaces 33 and 52. During the tuning step, the temperature of the outer heat transfer surface 33 is monitored. At some point in the upward movement of the weir, the temperature of the transfer surface 33 reaches a minimum and then begins to rise. At this point, it has been determined that the thermal resistance between the heat transfer surface and the fluid flowing across that surface is minimized to a very small value. This excellent heat transfer characteristic is achieved by using the weir 50 to optimize the water pressure and velocity as it flows across the heat transfer surface. FIG. 3 illustrates a typical curve 80 in which the thermal resistance, $\theta$, between the heat transfer surface and the fluid is plotted against the height, $h$, of the weir 50 in the cavity 18. The left baseline 83 of FIG. 3, represents $\theta$ of the weir 50 when resting on the bottom of the cavity 18, while the right baseline 84 represents the height of the weir when its upper surface 52 is flush against the heat transfer surface 33 of the device 31. At point 82 on the curve 80, it is seen that this thermal resistance value is minimized to a small value which closely approaches zero. At this point, the electrical and thermal characteristics of the device mounted on the apparatus 10 can be measured; for example, if the device 33 is a transistor, the typical static and dynamic characteristics of the transistor can be measured. Further, a thermal cycling test, commonly referred to as a "life" test, can be rapidly conducted since the thermal resistance between the heat transfer surface and the circulating fluid is substantially reduced. The thermal resistance between the high-voltage junction of the device and the heat transfer surface is easily determined, since its value is not longer obscured by the value of the thermal resistance between the heat transfer surface and the fluid. Further, the resilient ring 28 and the holding and locking member 30 obviate the need for bolting the device 31 to the base member 12, thus preventing damage to the plated finish of the heat transfer surface 33.

An alternate embodiment of the apparatus is shown in FIG. 4. This embodiment of the apparatus is similar to that shown in FIG. 1, except that the weir in the cavity of the base member is adapted to receive a stud mounted device. Noting FIG. 4, the apparatus 100 has a base member 12 (shown in cross section) having various features identical to the apparatus described with reference to FIG. 1, except that a weir 150 mounted in the cavity 18 of the base member 12 has a recess 153 which is adapted to receive a stud 135 extending from the heat transfer surface 133 of a device 131 mounted on the base member.

We claim:

1. Apparatus for cooling a power semiconductor device having an outer heat transfer surface, comprising:
   a. a base member having a major surface and a cavity therein, said surface having an aperture which communicates with said cavity;
   b. said base member having a channel in the interior of said base member, said channel having an input portion and an output portion each of which communicates with said cavity;
   c. means for holding said power semiconductor device in said aperture so that said outer heat transfer surface of said device is exposed in said cavity;
   d. means for circulating a fluid through said cavity and across said heat transfer surface, said circulating means including said input and said output portions; and
   e. means in said cavity for controlling said circulating fluid so as to minimize the thermal resistance between said heat transfer surface and said circulating fluid, said control means comprising a weir slidably mounted in said input and output portions of said channel.
2. Apparatus according to claim 1, further including means for tuning said weir in said cavity.
3. Apparatus according to claim 2, wherein said weir includes a recess which is adapted to receive, in spaced relation, a terminal lead extending from said heat transfer surface.
4. Apparatus according to claim 2, wherein said weir includes a recess which is adapted to receive a stud extending from said heat transfer surface.
5. Apparatus according to claim 2, further including a resilient insulating and sealing ring surrounding the periphery of said aperture in said surface of said base member.
6. Apparatus according to claim 5, wherein said holding means includes spring tensioning means for holding said device against said resilient ring.
7. A method for testing an encapsulated power semiconductor device of the type having an outer heat transfer surface thereon, comprising the steps of:
   a. providing a base member having a major surface and cavity therein, said surface having an aperture which communicates with said cavity;
   b. securing said device to said base member, so that said outer heat transfer surface is exposed in said cavity;
   c. providing a tuneable weir in said cavity and spaced from said heat transfer surface;
   d. circulating a fluid through said cavity and across said heat transfer surface and said weir;
   e. tuning said weir to control the flow of said circulating fluid in said cavity, so as to minimize the thermal resistance between said heat transfer surface and said fluid; and
   f. measuring the electrical and thermal characteristics of said device.

* * * * *